(12) United States Patent
Djordjevic et al.

(10) Patent No.: US 8,185,796 B2
(45) Date of Patent: May 22, 2012

(54) MITIGATION OF FIBER NONLINEARITIES IN MULTILEVEL CODED-MODULATION SCHEMES

(75) Inventors: Ivan B. Djordjevic, Tucson, AZ (US); Lei Xu, Princeton, NJ (US); Ting Wang, West Windsor, NJ (US)

(73) Assignee: NEC Laboratories America, Inc., Princeton, NJ (US)

( * ) Notice: Subject to any disclaimer, the term of this patent is extended or adjusted under 35 U.S.C. 154(b) by 727 days.

(21) Appl. No.: 12/392,335

(22) Filed: Feb. 25, 2009

(65) Prior Publication Data

US 2010/0050048 A1   Feb. 25, 2010

Related U.S. Application Data

(60) Provisional application No. 61/090,249, filed on Aug. 20, 2008.

(51) Int. Cl.
*G06F 11/00* (2006.01)
(52) U.S. Cl. ........................................... 714/755
(58) Field of Classification Search .................... 714/755
See application file for complete search history.

(56) References Cited

U.S. PATENT DOCUMENTS

| | | | |
|---|---|---|---|
| 2009/0177945 A1* | 7/2009 | Djordjevic et al. | 714/758 |
| 2009/0199065 A1* | 8/2009 | Djordjevic et al. | 714/752 |
| 2010/0042904 A1* | 2/2010 | Gunnam | 714/780 |

OTHER PUBLICATIONS

Djordjevic, I., et al. Mitigation of Linear and Nonlinear Impairments in High-Speed Optical Networks by Using LDPC-Coded Turbo Equalization. 2008 IEEE. IEEE Journal on Selected Areas in Communications. vol. 26, No. 6. Aug. 2008. pp. 73-83.
Alic, N., et al. Experimental Demonstration of 10GB/S NRZ Extended Dispersion-Limited Reach Over 600KM-SMF Link Without Optical Dispersion Compensation. OFC 2006, Paper OW57. Mar. 2006. (3 pgs).
Savory, S. Digital Filters for Coherent Optical Receivers. OSA Optics Express. vol. 16, No. 2. Jan. 2008. pp. 804-817.

* cited by examiner

*Primary Examiner* — Bryce Bonzo
(74) *Attorney, Agent, or Firm* — James Bitetto; Joseph Kolodka

(57) ABSTRACT

A receiver and method are provided for mitigation of finer non-linearities in multilevel coded-modulation schemes. The receiver includes a multilevel Bahl-Cocke-Jelinek-Raviv (BCJR) equalizer configured to receive channel samples of an input signal, partially mitigate fiber non-linearities, and provide symbol reliabilities. The receiver further includes a bit probabilities module coupled to the BCJR equalizer configured to calculate soft bit reliabilities from the symbol reliabilities. The receiver also includes one or more low-density parity-check (LDPC) decoders coupled to the bit probabilities module and the BCJR equalizer, configured to receive the soft bit reliabilities and output code words. The one or more LDPC decoders iteratively provide extrinsic soft information feedback to the BCJR equalizer to compensate for the fiber non-linearities.

24 Claims, 7 Drawing Sheets

MITIGATION OF FIBER NONLINEARITIES IN MULTILEVEL CODED-MODULATION SCHEMES

RELATED APPLICATION INFORMATION

This application claims priority to provisional application Ser. No. 61/090,249 filed on Aug. 20, 2008, incorporated herein by reference.

BACKGROUND

1. Technical Field

The present invention relates to optical communications, and more particularly to mitigation of fiber nonlinearities in multilevel coded-modulation schemes.

2. Description of the Related Art

In order to adapt to the ever-increasing demands of telecommunication needs, network operators already consider 100 Gb/s per dense wavelength division multiplexing (DWDM) channel transmission. At those data rates, the performance of fiber-optic communication systems is degraded significantly due to intra- and inter-channel fiber nonlinearities, polarization-mode dispersion (PMD), and chromatic dispersion. To deal with those channel impairments, novel advanced techniques in modulation and detection as well as coding and signal processing should be developed. To deal with chromatic dispersion and PMD, a number of channel equalization techniques have been proposed recently including a digital filtering approach, maximum likelihood sequence detection (MLSD), and turbo equalization. To simultaneously suppress chromatic dispersion and PMD, coded orthogonal frequency division multiplexing (OFDM) has been proposed. On the other hand, to deal with intra-channel nonlinearities, either constrained coding or turbo equalization may be used. Moreover, it has been shown that fiber nonlinearities such as chromatic dispersion and PMD can be simultaneously compensated for by using low-density parity-check (LDPC)-coded turbo equalization. However, the LDPC-coded turbo equalization scheme, although an excellent candidate to mitigate nonlinear and linear impairments simultaneously, so far has been studied for binary transmission only with direct detection.

SUMMARY

These and other drawbacks and disadvantages of the prior art are addressed by the present principles, which are directed to mitigating fiber nonlinearities in multilevel coded-modulation schemes using the multilevel Bahl-Cocke-Jelinek-Raviv (BCJR) algorithm.

According to an aspect of the present principles, a receiver is provided. The receiver includes a multilevel Bahl-Cocke-Jelinek-Raviv (BCJR) equalizer configured to receive channel samples of an input signal, partially mitigate fiber non-linearities, and provide symbol reliabilities. The receiver further includes a bit probabilities module coupled to the BCJR equalizer configured to calculate soft bit reliabilities from the symbol reliabilities. The receiver also includes one or more low-density parity-check (LDPC) decoders coupled to the bit probabilities module and the BCJR equalizer, configured to receive the soft bit reliabilities and output code words. The one or more LDPC decoders iteratively provide extrinsic soft information feedback to the BCJR equalizer to compensate for the fiber non-linearities.

According to another aspect of the present principles, there is provided a method. The method includes receiving and sampling an input signal using a sampler. The method further includes partially mitigating fiber non-linearities using a multilevel Bahl-Cocke-Jelinek-Raviv (BCJR) equalizer configured to receive channel samples of the input signal and provide symbol reliabilities. The method also includes calculating soft bit reliabilities from the symbol reliabilities, and decoding the input signal to output code words using one or more low-density parity-check (LDPC) decoders based on the soft bit reliabilities. The method additionally includes iteratively feeding back extrinsic soft information to the BCJR equalizer to compensate for the fiber non-linearities.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
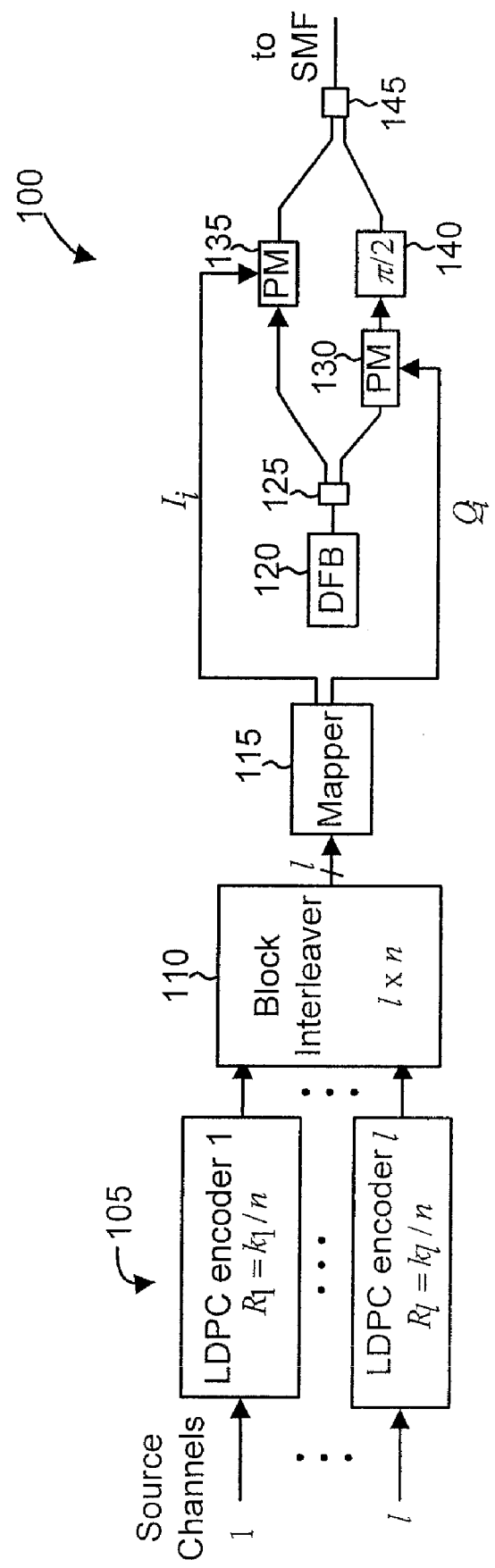
FIG. 1 is a block diagram showing a transmitter in accordance with an embodiment of the present principles.

Referring now in detail to the figures in which like numerals represent the same or similar elements and initially to FIG. 1, a transmitter 100 in accordance with an embodiment of the present principles is shown. The transmitter 100 includes a series of low-density parity-check encoders 105, a block interleaver 110, a mapper 115, a distributed feedback (DFB) laser 120, a 3 dB coupler (splitter) 125, a first phase modulator (PM) 130, a second phase modulator 135, a phase shifter ($\pi/2$) 140, and a 3 dB coupler (combiner) 145.

Figure 2:
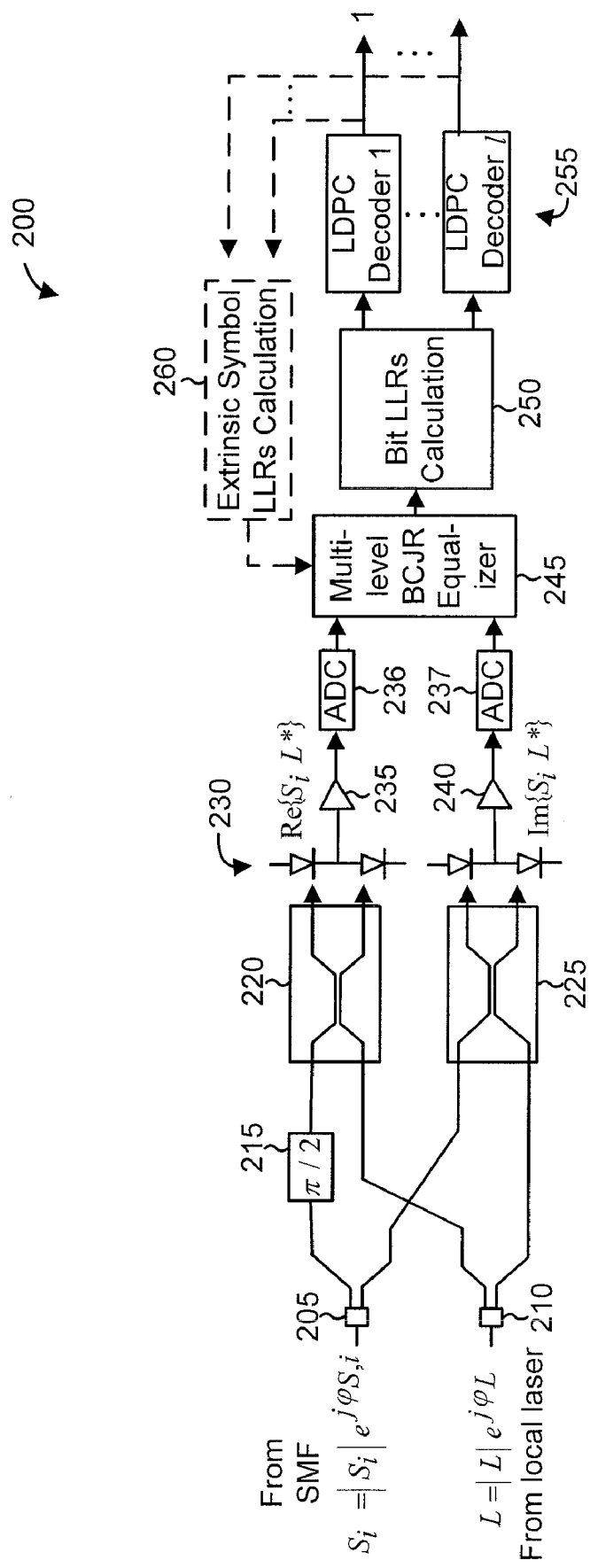
FIG. 2 is a block diagram showing a receiver in accordance with an embodiment of the present principles.

FIG. 2 shows a receiver 200 in accordance with an embodiment of the present principles. The receiver 200 includes a first 3 dB coupler 205, a second 3 dB coupler 210, a phase shifter ($\pi/2$) 215, an upper directional coupler 220, a lower directional coupler 225, two balanced photodetectors 230, a trans impedance amplifier 235, a trans impedance amplifier 240, an analog to digital converter (ADC) 236, an ADC 237, a multilevel Bahl-Cocke-Jelinek-Raviv (BCJR) equalizer 245, a bit log-likelihood ratio (LLR) module 250, a series of LDPC decoders 255, and an extrinsic symbol LLRs calculation module 260.

Elements of the transmitter 100 and receiver 200 are described in further detail herein after with respect to various aspects of the present principles.

Figure 3:
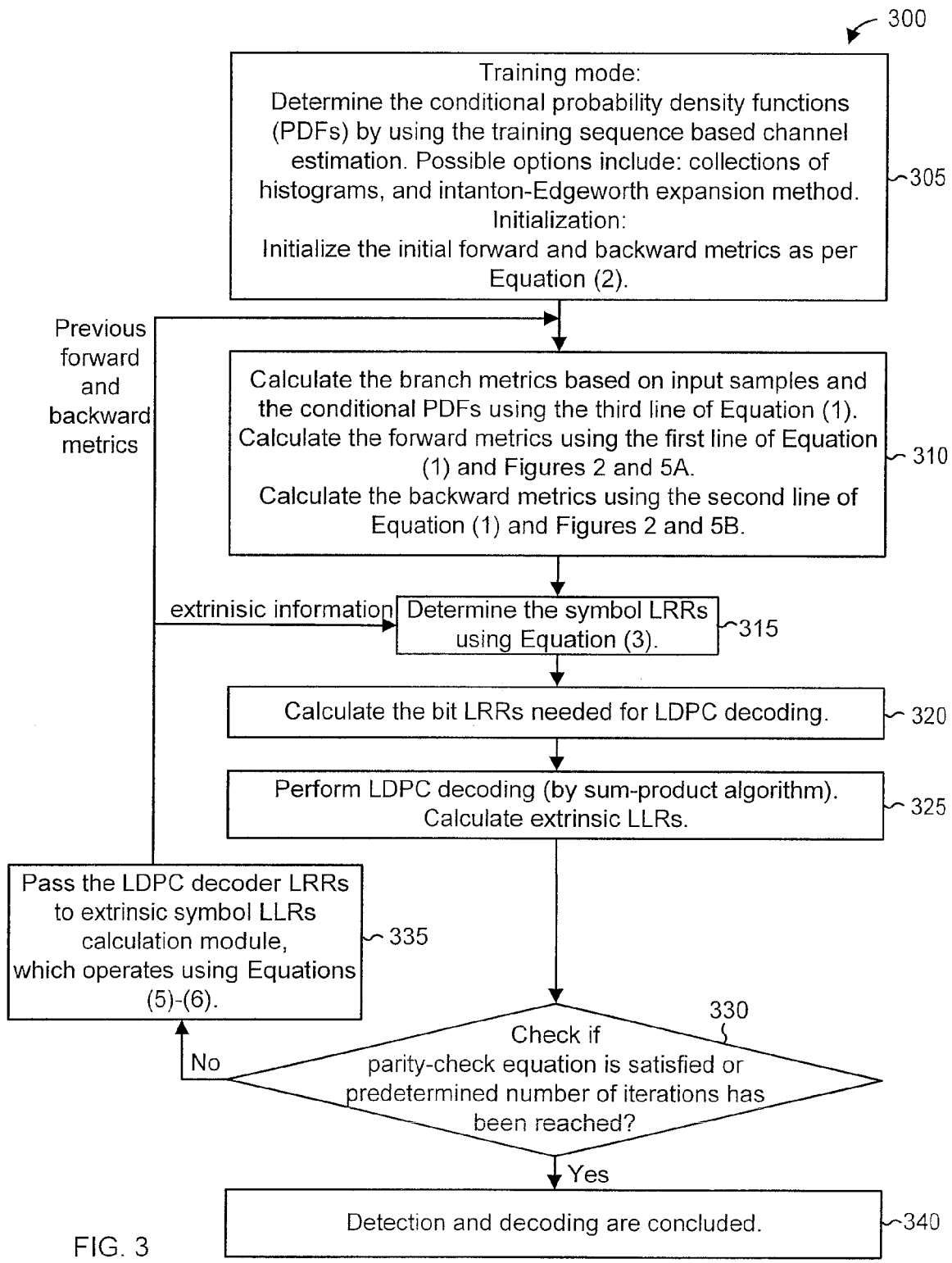
FIG. 3 is a flow diagram showing a method for simultaneous turbo-equalization and coded-demodulation in a multilevel coded modulation scheme in accordance with an embodiment of the present principles.

FIG. 3 shows a method for simultaneous turbo-equalization and coded-demodulation in a multilevel coded modulation scheme, in accordance with an embodiment of the present principles.

At step 305, which corresponds to a training mode, the conditional probability density functions (PDFs) are determined using the training sequence based channel estimation. The training sequence based channel estimation may involve, but is not limited to, a collection of histograms, and an instanton-Edgeworth expansion method. Moreover, at step 305, initial forward and backward metrics are initialized as per Equation (2) below.

At step 310, branch metrics are calculated by the multilevel BCJR equalizer 245 based on input samples and the conditional PDFs, using the third line in Equation (1). Moreover, at step 310, the forward metrics are calculated by the multilevel BCJR equalizer 245 using the first line of Equation (1) and FIGS. 2 and 5A, and the backward metrics are calculated using the second line of Equation (1) and FIGS. 2 and 5B.

At step 315, the symbol LLRs are determined by the by the multilevel BCJR equalizer 245 using Equation (3).

At step 320, the bit LLRs needed for LDPC decoding are calculated by the bit LLRs calculation module 250 using Equation (4).

At step 325, LDPC decoding is performed by the bank of LDPC decoders 255 using, for example, sum-product algorithm, and extrinsic LLRs are calculated.

At step 330, it is determined whether or not a parity-check equation has been satisfied or whether a predetermined number of iterations has been reached.

If so, then at step 340 detection and decoding are concluded. Otherwise, control is passed to step 335.

At step 335, the LDPC decoder LLRs are passed into the extrinsic symbol LLRs calculation module 260 which operates using Equations (5)-(6).

Steps of the method 300 are described in further detail herein after with respect to various aspects of the present principles.

Embodiments described herein may be entirely hardware, entirely software or including both hardware and software elements. In a preferred embodiment, the present invention is implemented in software, which includes but is not limited to firmware, resident software, microcode, etc.

Embodiments may include a computer program product accessible from a computer-usable or computer-readable medium providing program code for use by or in connection with a computer or any instruction execution system. A computer-usable or computer readable medium may include any apparatus that stores, communicates, propagates, or transports the program for use by or in connection with the instruction execution system, apparatus, or device. The medium can be magnetic, optical, electronic, electromagnetic, infrared, or semiconductor system (or apparatus or device) or a propagation medium. The medium may include a computer-readable medium such as a semiconductor or solid state memory, magnetic tape, a removable computer diskette, a random access memory (RAM), a read-only memory (ROM), a rigid magnetic disk and an optical disk, etc.

Herein, we propose the multilevel (M≧2) maximum a posteriori probability (MAP) turbo equalization scheme based on a multilevel Bahl-Cocke-Jelinek-Raviv (BCJR) algorithm-based equalizer (also interchangeably referred to herein as a "multilevel BCJR equalizer"). This scheme is suitable for simultaneous nonlinear and linear impairments mitigation in multilevel coded-modulation schemes with coherent detection. When used in combination with large girth LDPC codes as channel codes, this scheme represents a universal equalizer scheme for simultaneous suppression of fiber nonlinearities (such as, for example, intra-channel fiber nonlinearities and nonlinear phase noise) and linear impairments (such as chromatic dispersion and PMD). The BCJR algorithm is the MAP algorithm that can be used not only to decode different convolutional and block codes, but also as a MAP detector. On the other hand, the use of large girth LDPC codes increases the minimum distance, and de-correlates the extrinsic info in LDPC decoding process. To further improve the overall bit-error ratio (BER) performance, we perform the iteration of extrinsic LLRs between LDPC decoder and multilevel BCJR equalizer. We use the extrinsic information transfer (EXIT) chart approach due to ten Brink to match the LDPC decoders, for large-girth quasi-cyclic LDPC codes, and multilevel BCJR equalizer. We further show how to combine this scheme with multilevel coded-modulation schemes with coherent detection.

We also propose a method to calculate the ultimate channel capacity limits assuming an independent identically distributed (IID) source.

Given the fact that a LDPC-coded turbo equalizer, based on a multilevel BCJR algorithm, is an excellent nonlinear intersymbol interference (ISI) equalizer candidate, naturally the preceding raises the question about fundamental limits on channel capacity of coded-modulation schemes. We also provide the IID channel capacity study.

Hereinafter, the ordering of discussion is as follows: the LDPC-coded turbo equalization scheme, based on multilevel BCJR algorithm, is described, followed by a description of a design of large girth LDPC codes used in the disclosed turbo equalizer. Thereafter, we study the efficiency of the LDPC-coded turbo equalizer in suppression of fiber nonlinearities.

As mentioned above, we propose the multilevel BCJR equalizer suitable for simultaneous suppression of both nonlinear and linear impairments in multilevel coded modulation schemes with coherent detection.

Figure 4:
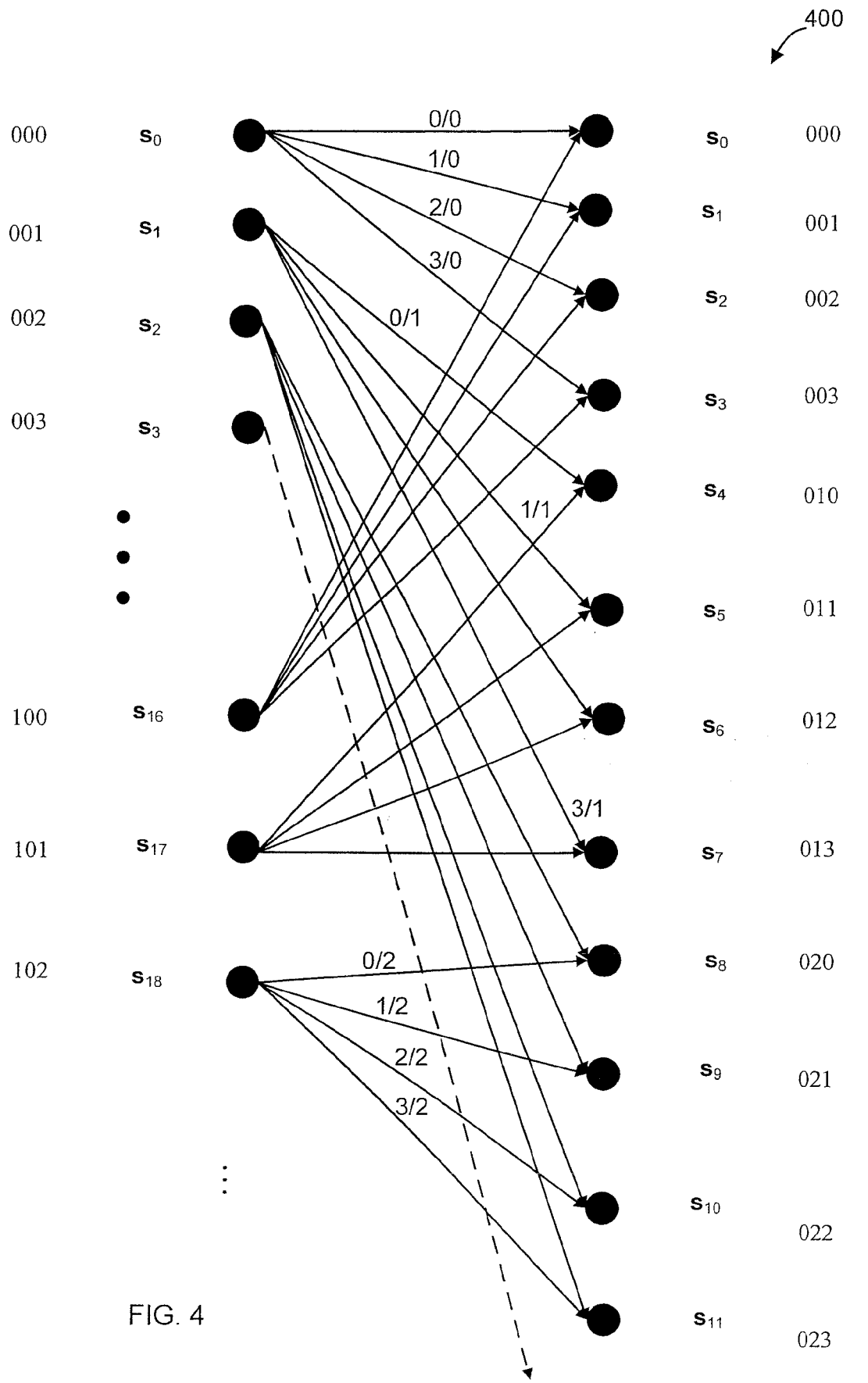
FIG. 4 is a diagram showing an exemplary dynamic trellis of memory $2m+1=3$ for 4-ary modulation formats in accordance with an embodiment of the present principles.

The multilevel BCJR equalizer operates on a discrete dynamical trellis description of the optical channel. This dynamical trellis is uniquely defined by the following triplet: the previous state, the next state, and the channel output. The state in the trellis is defined as $s_j=(x_{j-m}, x_{j-m+1}, \ldots, x_j, x_{j+1}, \ldots, x_{j+m})=x[j-m,j+m]$, where $x_k$ ($k=j-m, \ldots, j+m$) denotes the index of the symbol from the following set of possible indices $x=\{0, 1, \ldots, M-1\}$, with M being the number of points in a corresponding M-ary signal constellation such as M-ary phase-shift keying (PSK), M-ary quadrature-amplitude modulation (QAM) or M-ary polarization-shift keying (PolSK). Every symbol carries $l=\log_2 M$ bits, using the appropriate mapping rule (natural, Gray, anti-Gray, etc.) For example, for QPSK and Gray mapping, the following sequences of bits 00, 01, 11, and 10 are mapped to the following signal constellation points QPSK(0)=(0,1), QPSK(1)=(1,1), QPSK(2)=(-1,0) and QPSK(3)=(-1,-1), respectively. The memory of the state is equal to $2m+1$, with 2m being the number of symbols that influence the observed symbol from both sides. An exemplary dynamic trellis 400 of memory $2m+1=3$ for 4-ary modulation formats (such as QPSK) is shown in FIG. 4. The dynamic trellis 400 has $M^{2m+1}=64$ states ($s_0, s_1, \ldots, s_{63}$), each of which corresponds to a different 3-symbol pattern (configuration). The state index is determined by considering (2m+1) symbols as digits in a numerical system with base M. For example, in FIG. 4, the quaternary numerical system (with the base 4) is used. The left column in the dynamic trellis 400 represents the current states and the right column denotes the terminal states. The branches are labeled by two symbols, where the input symbol is the last symbol in the initial state, and the output symbol is the central symbol of the terminal state. Therefore, the main difference with respect to other channels (such as magnetic recording channel and wireless channels) where the current symbol is affected only by the previous symbols is that in an optical channel a current symbol is affected by both previous and incoming symbols. For the complete description of the dynamical trellis 400, the transition probability density functions $p(y_j|x_j)=p(y_j|s)$, $s \in S$ are needed; where S is the set of states in the trellis, and $y_j$ is the set of complex number samples (corresponding to the transmitted symbol index $x_j$) with real part being the in-phase channel sample and imaginary part being the quadrature channel sample. The conditional PDFs can be determined from collected histograms or by using an instanton-Edgeworth expansion method. The number of edges originating in any of the left-column states is M, and the number of merging edges in an arbitrary terminal state is also M.

Referring back to the transmitter 100 shown in FIG. 1, the bit streams originating from l different information sources are encoded using different $(n,k_i)$ LDPC codes of code rate $R_i=k_i/n$, where $k_i$ denotes the number of information bits of ith (i=1, 2, ..., m) component LDPC code, and n denotes the codeword length, which is the same for all LDPC codes. The use of different LDPC codes allows us optimally to allocate the code rates. The bit-interleaved coded modulation (BICM) scheme can be considered as a special multilevel coding (MLC) scheme in which all of the component codes are of the same rate. The outputs of l LDPC encoders 105 are written row-wise into a block-interleaver 110. The mapper accepts l bits at time instance j from the (l×n) interleaver 110 column-wise and determines the corresponding -ary (M=$2^l$) signal constellation point $s_j=(\phi_{1,j}, \phi_{2,j})=|s_j|\exp(j\phi_j)$. The coordinates correspond to in-phase and quadrature components of M-ary QAM constellation, after appropriate mapping.

Referring back to the receiver 200 shown in FIG. 2, the received electrical field at the ith transmission interval is denoted by $S_i=|S_i|\exp(j\phi_{S,i})$, $\phi_{S,i}=\phi_i+\phi_{S,PN}$, where $\phi_i$ denotes the data phasor and $\phi_{S,PN}$ denotes the laser phase noise process of transmitting laser. The local laser electrical field is denoted by $L=|L|\exp(j\phi_L)$ where $\phi_L$ denotes the laser phase noise process of the local laser. The outputs of upper-balanced branch 220 and the lower-balanced branch 225, proportional to $\text{Re}\{S_iL^*\}$ and $\text{Im}\{S_iL^*\}$ respectively, are used as inputs of multilevel BCJR equalizer 245.

Before we explain how the symbol LLRs are calculated in the multilevel BCJR equalizer 245 let us introduce the following notation. The forward metric is defined as $\alpha_j(s)=\log\{p(s_j=s,y[1,j])\}$ (j=1, 2, ..., n). The backward metric is defined as $\beta_j(s)=\log\{p(y[j+1,n]|s_j=s)\}$. The branch metric is defined as $\gamma_j(s',s)=\log[p(s_j=s,y_j,s_{j-1}=s')]$. The corresponding metrics can be calculated iteratively as follows:

$$\alpha_j(s) = \max_{s'}{}^* [\alpha_{j-1}(s') + \gamma_j(s', s)], \quad (1)$$

$$\beta_{j-1}(s') = \max_{s}{}^* [\beta_j(s) + \gamma_j(s', s)],$$

$$\gamma_j(s', s) = \log[p(y_j|x[j-m, j+m])P(x_j)].$$

The max*-operator is defined by max*(x,y)=log($e^x+e^y$), and it is efficiently calculated by max*(x,y)=max(x,y)+$c_f$(x, y), where $c_f$(x,y) is the correction factor, defined as $c_f$(x, y)=log [1+exp(-|x-y|)], which is commonly approximated or implemented using a look-up table. $p(y_j|x[j-m,j+m])$ is obtained, as already explained above, by either collecting the histograms or by instanton-Edgeworth expansion method, and $P(x_j)$ represents a priori probability of transmitted symbol $x_j$. In the first outer iteration $P(x_j)$ is set to either 1/M (because equally probable transmission is observed) for an existing transition from the trellis given in FIG. 4, or to zero for a non-existing transition.

The outer iteration is defined as the calculation of symbol LLRs in the multilevel BCJR equalizer 245, the calculation by the bit LLRs calculation module 250 of corresponding bit LLRs needed for LDPC decoding, the LDPC decoding by the series of LDPC decoders 255, and the calculation by the extrinsic symbol LLRs calculation module 260 of extrinsic symbol LLRs needed for the next iteration. The iterations within the LDPC decoders 255, based on min-sum-with-correction-term algorithm, are referred to herein as inner iterations. The initial forward and backward metrics values are set to the following:

$$\alpha_0(s) = \begin{cases} 0, s = s_0 \\ -\infty, s \neq s_0 \end{cases} \text{ and } \beta_n(s) = \begin{cases} 0, s = s_0 \\ -\infty, s \neq s_0 \end{cases}, \quad (2)$$

where $s_0$ is an initial state.

Figure 5A:
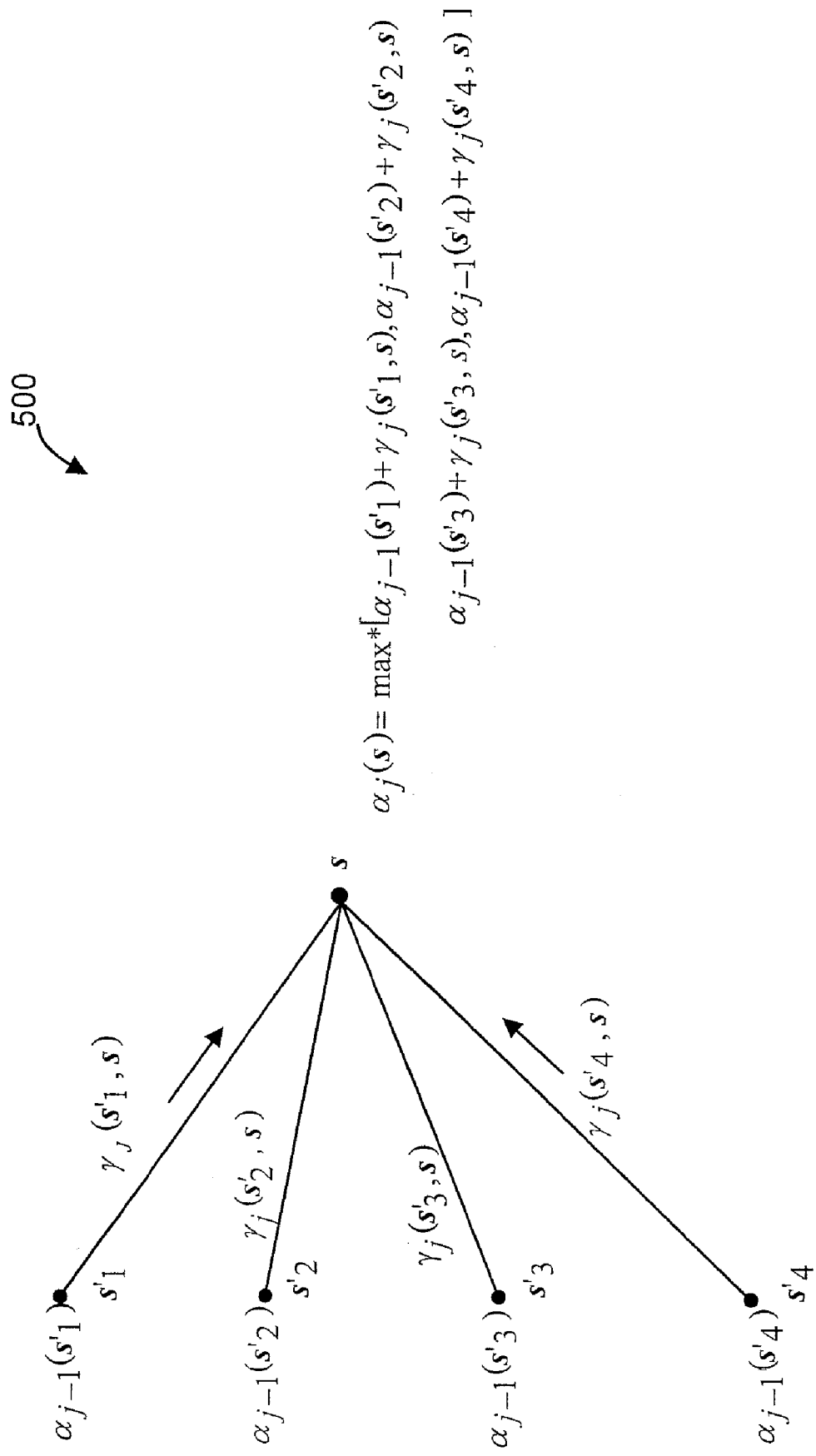
FIGS. 5A and 5B are diagrams respectively showing the forward and backward recursion steps of the 4-level BCJR MAP detector of FIG. 2 in accordance with an embodiment of the present principles.
Figure 5B:
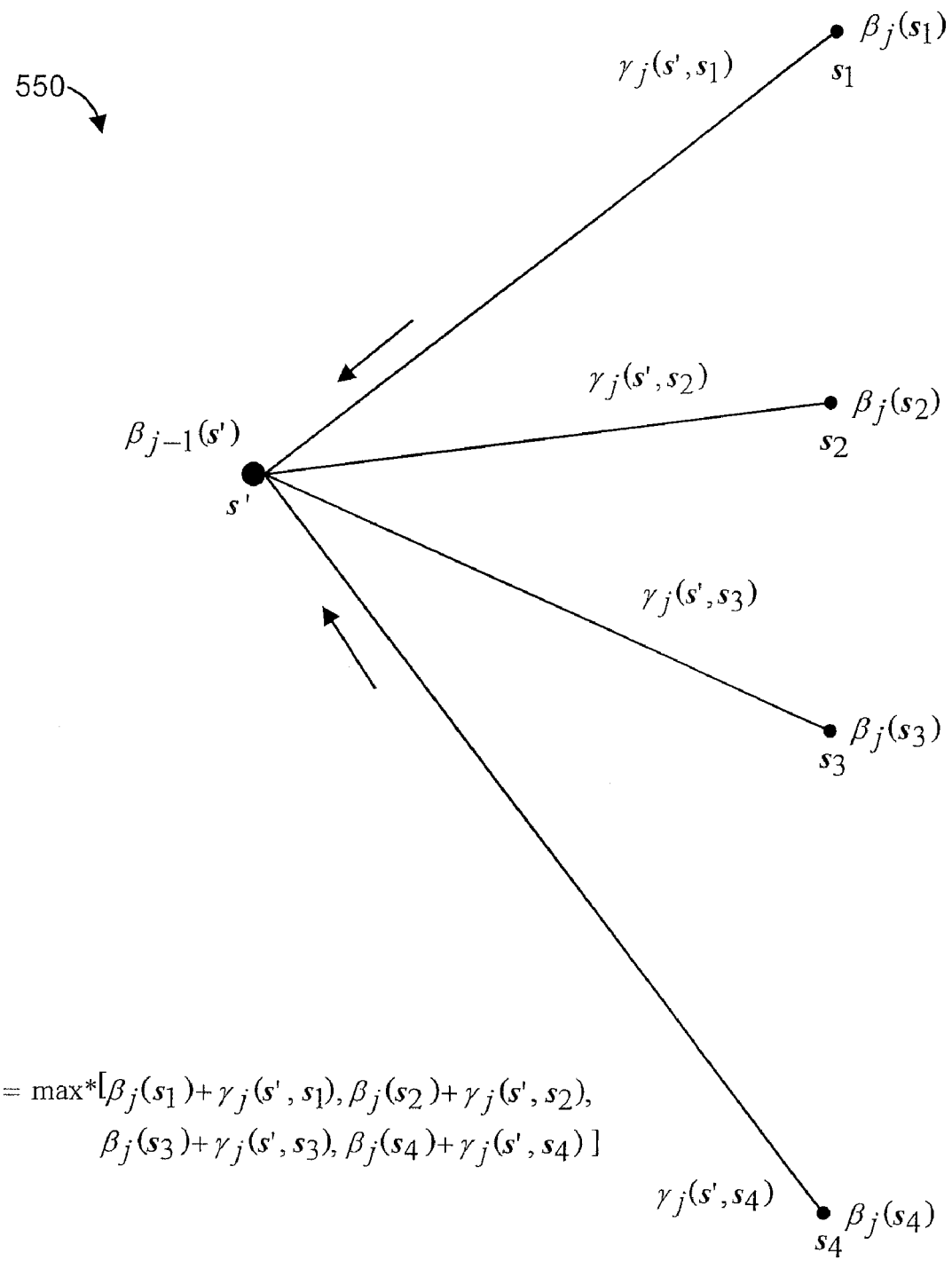
Figure 6:
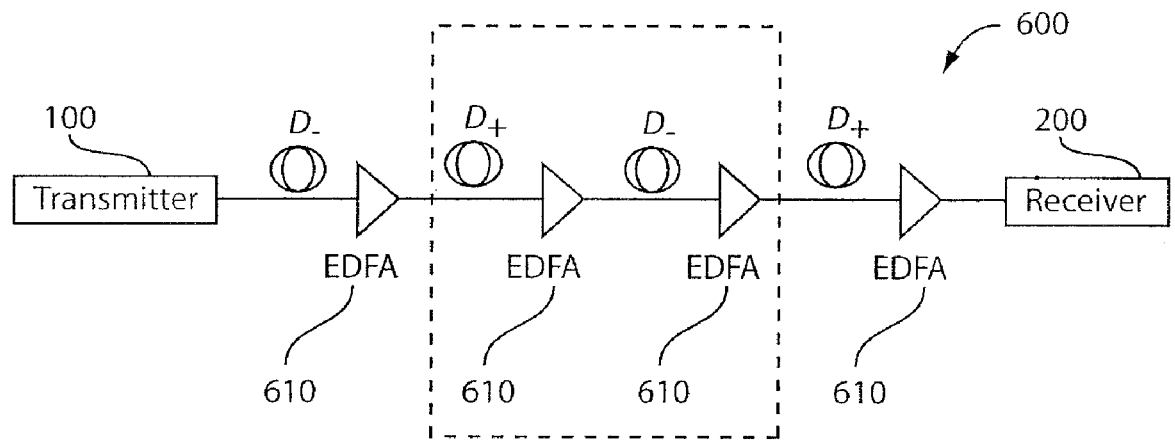
FIG. 6 is a diagram showing an exemplary submarine-like dispersion map in accordance with an embodiment of the present principles.

Let $s'=x[j-m-1, j+m-1]$ represent the previous state, $s=x[j-m, j+m]$ the present state, $x=(x_1, x_2, \ldots, x_n)$—the transmitted word of symbols, and $y=(y_1, y_2, \ldots, y_n)$—the received sequence of samples. The LLR, denoting the symbol reliability, of $x_j=\delta$ (j=1, 2, ..., n), can calculated by $$\Lambda(x_j = \delta) = \max_{(s^1,s): x_j=\delta}{}^* [\alpha_{j-1}(s^1) + \gamma_j(s^1, s) + \beta_j(s)] - \quad (3)$$

$$\max_{(s^1,s): x_j=\delta_0}{}^* [\alpha_{j-1}(s^1) + \gamma_j(s^1, s) + \beta_j(s)],$$

where $\delta$ represents the observed symbol ($\delta \in \{0, 1, \ldots, M-1\}\setminus\{\delta_0\}$), and $\delta_0$ is the referent symbol. The forward and backward metric is calculated using the Equation (1). The forward and backward recursion steps of the 4-level BCJR MAP detector 245 are illustrated in FIGS. 5A and 5B, respectively. In FIG. 5A, s denotes an arbitrary terminal state, which has M=4 edges originating from corresponding initial states, denoted as $s'_1$, $s'_2$, $s'_3$, and $s'_4$. Notice that the first term in branch metric (see Equation (1)) is calculated only once, before the detection/decoding takes place, and stored. The second term, log($P(x_j)$), is recalculated in every outer iteration. The forward metric of state s in jth step (j=1, 2, ..., n) is updated by preserving the maximum term (in max*-sense) $\alpha_{j-1}(s'_k)+\gamma_j(s,s'_k)$ (k=1, 2, 3, 4). The procedure is repeated for every state in column of terminal states of jth step. The similar procedure is used to calculate the backward metric of state s', $\beta_{j-1}(s')$, (in (j−1)th step) as shown in FIG. 5B, but now proceeding in backward direction (j=n,n−1, ..., 1).

Let $c_k$ denote the kth bit carried by the symbol denoted by index $x_j$. The bit LLRs $c_k$ (k=1, 2, ..., l) are determined from symbol LLRs of Equation (3), by the bit LLRs calculation module 250, as follows:

$$L(\hat{C}_k) = \log \frac{\sum_{x_j: c_k=0} \exp[\Lambda(x_j)]}{\sum_{x_j: c_k=1} \exp[\Lambda(x_j)]}, \quad (4)$$

where the summation in the nominator is performed over all symbol indices $x_j$ having 0 at position k, while the summation in the denominator is performed over all symbol indices $x_j$ having 1 at the same position.

The bit LLRs calculation module 250 forwards the bit LLRs from Equation (4) to the soft-decoding LDPC decoders 255. In an embodiment, the decoders 255 may be based upon, but are not limited to, a sum-product-with-correction-term algorithm. To improve the overall performance of the LDPC-coded turbo equalizer 245 we perform the iteration of extrinsic LLRs between the LDPC decoders 255 and the multilevel BCJR equalizer 245. The extrinsic bit LLRs at the input of extrinsic symbol calculation module 260, in a tth iteration, are determined by the following:

$$L_{LDPC,e}(c_k^{(t)}) = L_{LDPC}(c_k^{(t)}) - L_{LDCP}(c_k^{(t-1)}), \quad (5)$$

where $L_{LDPC}(c_k)$ is the corresponding LLR of bit $c_k$, while t and t−1 are used to denote the current and previous iterations. The extrinsic bit LLRs from Equation (5) are used to calculate the extrinsic symbol LLRs (in extrinsic symbol calculation module 260 of FIG. 2), which are used as a priori symbol LLRs, in the third line of Equation (1) by the following:

$$L_{BCJR,a}(x_j) = \log[P(x_j)] = \sum_{k=0}^{l-1}(1-c_k)L_{D,e}(c_k). \quad (6)$$

The use of large girth LDPC codes is essential, because the large girth, in addition to increasing the minimum distance, also de-correlates extrinsic bit LLRs. To facilitate the implementation at high-speed, we prefer the use of quasi-cyclic codes rather than random LDPC codes. To optimally match the multilevel BCJR equalizer 245 and LDPC decoders 255, quasi-cyclic LDPC codes are selected using the concept of EXIT charts.

Notice that the complexity of the dynamic trellis 400 grows exponentially, because the number of states is determined by $M^{2m+1}$, so that the increase in signal constellation leads to increase of the base, while the increase in channel memory assumption (2m+1) leads to an increase of the exponent. We have shown in the case of QPSK transmission that even a small memory assumption (2m+1=3) leads to significant performance improvement with respect to the memory less case (m=0). For larger constellations and/or larger memories the reduced multilevel BCJR algorithm is to be used instead. For example, instead of the detection of sequence of symbols corresponding to the length of code word n, we can observe shorter sequences. Further, we do not need to memorize all branch metrics but several of the largest ones. In forward/backward metrics' update, we need to update only the metrics of those states connected to the edges with dominant branch metrics, and so on.

A description will now be given regarding large girth quasi-cyclic LDPC codes, in accordance with an embodiment of the present principles.

The parity check-matrix H of quasi-cyclic LDPC codes considered herein can be represented by the following:

$$H = \begin{bmatrix} I & I & I & \ldots & I \\ I & P^{S[1]} & P^{S[2]} & \ldots & P^{S[c-1]} \\ I & P^{2S[1]} & P^{2S[2]} & \ldots & P^{2S[c-1]} \\ \ldots & \ldots & \ldots & \ldots & \ldots \\ I & P^{(r-1)S[1]} & P^{(r-1)S[2]} & \ldots & P^{(r-1)S[c-1]} \end{bmatrix}, \quad (7)$$

where I is p×p (p is a prime number) identity matrix, P is p×p permutation matrix ($p_{i,i+1}=p_{p,1}$, i=1,2, ..., p−1. Other elements of P are zeros, while r and c represent the number of rows and columns in Equation (7), respectively. The set of integers S are to be carefully chosen from the set {0,1, ..., p−1} so that the cycles of short length, in a corresponding Tanner (bipartite) graph representation of (7) are avoided. We have shown that large girth (the shortest cycle in bipartite graph), g≧10, LDPC codes provide excellent improvement in coding gain over corresponding turbo-product codes (TPCs). At the same time, complexity of LDPC codes is lower than that of TPCs, selecting them as excellent candidates for application to systems for 40 Gb/s and 100 Gb/s transmission. For example, by selecting p=1123 and S={0, 2, 5, 13, 20, 37, 58, 91, 135, 160, 220, 292, 354, 712, 830} an LDPC code of rate 0.8, girth g=10, column weight 3 and length N=16845 is obtained.

A description will now be given regarding the mitigation of intra-channel nonlinearities via LDPC coded turbo equalization based on a multilevel BCJR algorithm.

The 4-level BCJR equalizer with memory 2m+1=3 provides more than 1 order in magnitude improvement in bit error rate (BER) over the memory-less case (2m+1=1). For the turbo equalization scheme based on the 4-level BCJR equalizer of memory 2m+1=1 and the LDPC(16935,13550) code of girth 10 and column weight 3, we achieve transmission over 55 spans (6600 km) without any error. On the other hand, for the turbo equalization scheme based on 4-level BCJR equalizer of memory 2m+1=3 and the same LDPC code, we are able to achieve even 8520 km of error free transmission at aggregate rate of 100 Gb/s.

A description will now be given regarding channel capacity in accordance with an embodiment of the present principles.

Here we address the problem of calculating channel capacity for an IID information source, also known in the literature as the achievable information rate. The IID channel capacity represents a lower bound on channel capacity. To calculate the IID channel capacity, similarly we model the whole transmission system as the nonlinear ISI channel, in which m previous and next m symbols influence the observed symbol. The optical communication system is characterized by the conditional PDF of the output complex vector of samples $y=(y_1, \ldots, y_n, \ldots)$, where $y_i=(\text{Re}\{y_i\}, \text{Im}\{y_i\})\in Y$ (Y represents the set of all possible outputs), given the source sequence $x=(x_1, \ldots, x_n, \ldots)$, $x_i\in X=\{0,1, \ldots, M-1\}$. The $\text{Re}\{y_i\}$ corresponds to the in-phase channel sample, and the $\text{Im}\{y_i\}$ represents the quadrature channel sample. The information rate can be calculated as follows:

$$I(Y;X) = H(Y) - H(Y|X), \quad (8)$$

where $H(U)=E(\log_2 P(U))$ denotes the entropy of a random variable U and $E(\cdot)$ denotes the mathematical expectation operator. By using the Shannon-McMillan-Brieman theorem that states the following:

$$E(\log_2 P(Y)) = \lim_{m\to\infty}(1/n)\log_2 P(y[1,n]), \quad (9)$$

where $y[1,n]=(y_1, \ldots, y_n)$. The information rate can be determined by calculating $\log_2(P(y[1,n]))$, by propagating the sufficiently long source sequence. By substituting Equation (9) into Equation (8), we obtain the following expression suitable for practical calculation of IID channel capacity:

$$I(Y;X) = \lim_{n\to\infty}\frac{1}{n}\left[\sum_{i=1}^{n}\log_2 P(y_i|y[1,i-1],x[1,n]) - \sum_{i=1}^{n}\log_2 P(y_i|y[1,i-1])\right] \quad (10)$$

Based on the description of the multilevel BCJR equalizer and LDPC-coded turbo equalizer set forth above, the conditional PDF may be represented as follows: $P(y_i|y[1,i-1],x[1,n])=P(y_i|x[i-m,i+m])=P(y_i|s)$. Therefore, the first term in Equation (10) can be straightforwardly calculated from transition PDFs $P(y_i|s)$. To calculate $\log_2 P(y_i|y[1,i-1])$, we use the forward recursion of the multilevel BCJR algorithm described above, wherein the forward metric and backward metric were modified as follows:

$$\alpha_j(s) = \max_{s'}^* \lfloor \alpha_{j-1}(s') + \gamma_j(s', s) - \log_2 M \rfloor, \quad (11)$$

$$\gamma_j(s', s) = \log[p(y_j|x[j-m, j+m])].$$

The ith term $\log_2 P(y_i[1, i-1])$ was calculated iteratively:

$$\log_2 P(y_i|y[1, i-1]) = \max_s^* \alpha_i(s) \quad (12)$$

where max*-operator was applied for all s∈S (S denotes the set of states in the trellis 400 shown in FIG. 4), Based on IID channel capacity study we conclude that by using the longer LDPC code (of rate R=0.8) than that used hereinbefore with respect to the previously described results, we are able to extend the transmission distance by 600 km for BCJR equalizer memory m=0, and even by 1200 km (resulting in total transmission length 9720 km) for BCJR equalizer memory m=1.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A receiver, comprising:
   a multilevel Bahl-Cocke-Jelinek-Raviv (BCJR) equalizer configured to receive channel samples of an input signal, partially mitigate fiber non-linearities, and provide symbol reliabilities;
   a bit probabilities module coupled to said BCJR equalizer configured to calculate soft bit reliabilities from the symbol reliabilities; and
   one or more low-density parity-check (LDPC) decoders coupled to said bit probabilities module and said BCJR equalizer, configured to receive the soft bit reliabilities and output code words, said one or more LDPC decoders iteratively providing extrinsic soft information feedback to said BCJR equalizer to compensate for the fiber non-linearities.

2. The receiver of claim 1, wherein the soft bit reliabilities are in a form of log-likelihood ratios (LLRs).

3. The receiver of claim 1, wherein the one or more LDPC decoders stop iterating if a valid code word is reached or a number of iterations is exceeded.

4. The receiver of claim 1, wherein said BCJR equalizer is maximum a posteriori probability (MAP) equalizer.

5. The receiver of claim 1, wherein said BCJR equalizer operates on a discrete dynamical trellis description of an optical channel upon which the input sequences are received.

6. The receiver of claim 5, wherein the discrete dynamical trellis description comprises a triplet: a previous state, a next state, and a channel output.

7. The receiver of claim 5, wherein the discrete dynamical trellis description is based on at least one of one or more histograms and an instanton-Edgeworth expansion method.

8. The receiver of claim 1, wherein said one or more LDPC decoders are based on a min-sum-with-correction-term algorithm.

9. The receiver of claim 1, wherein said BCJR equalizer is configured to perform turbo equalization.

10. The receiver of claim 1, wherein said BCJR equalizer is configured to simultaneously mitigate the fiber non-linearities and linear channel impairments relating to intra-channel four-wave mixing (IFWM), intra-channel cross-phase modulation (IXPM), nonlinear phase noise, self-phase modulation (SPM), residual chromatic dispersion, and polarization-mode dispersion (PMD).

11. The receiver of claim 1, wherein said BCJR equalizer is configured to decode different convolutional and block codes and as a maximum a posteriori probability (MAP) detector.

12. The receiver of claim 1, further comprising a coherent detector coupled to said BCJR equalizer for initially detecting the input signal.

13. A method, comprising:
   receiving and sampling an input signal using a sampler;
   partially mitigating fiber non-linearities using a multilevel Bahl-Cocke-Jelinek-Raviv (BCJR) equalizer configured to receive channel samples of the input signal and provide symbol reliabilities;
   calculating soft bit reliabilities from the symbol reliabilities;
   decoding the input signal to output code words using one or more low-density parity-check (LDPC) decoders based on the soft bit reliabilities; and
   iteratively feeding back extrinsic soft information to the BCJR equalizer to compensate for the fiber non-linearities.

14. The method of claim 13, wherein the soft hit reliabilities are in a form of log-likelihood ratios (LLRs).

15. The method of claim 13, wherein the one or more LDPC decoders stop iterating if a valid code word is reached or a number of iterations is exceeded.

16. The method of claim 13, wherein said BCJR equalizer is maximum a posteriori probability (MAP) equalizer.

17. The method of claim 13, wherein said BCJR equalizer operates on a discrete dynamical trellis description of an optical channel upon which the input sequences are received.

18. The method of claim 17, wherein the discrete dynamical trellis description comprises a triplet: a previous state, a next state, and a channel output.

19. The method of claim 17, wherein the discrete dynamical trellis description is based on at least one of one or more histograms and an instanton-Edgeworth expansion method.

20. The method of claim 13, wherein said one or more LDPC decoders are based on a min-sum-with-correction-term algorithm.

21. The method of claim 13, wherein said BCJR equalizer is configured to perform turbo equalization.

22. The method of claim 13, wherein said BCJR equalizer is configured to simultaneously mitigate the fiber non-linearities and linear channel impairments relating to intra-channel four-wave mixing (IFWM), intra-channel cross-phase modulation (IXPM), nonlinear phase noise, self-phase modulation (SPM), residual chromatic dispersion, and polarization-mode dispersion (PMD).

23. The method of claim 13, wherein said BCJR equalizer is configured to decode different convolutional and block codes and as a maximum a posteriori probability (MAP) detector.

24. The method of claim 13, further comprising initially detecting the input signal using a coherent detector.

* * * * *